(12) United States Patent
Nishikawa (10) Patent No.: US 6,875,981 B2
(45) Date of Patent: Apr. 5, 2005

(54) SCANNING ATOM PROBE AND ANALYSIS METHOD UTILIZING SCANNING ATOM PROBE

(75) Inventor: Osamu Nishikawa, Kanazawa (JP)

(73) Assignee: Kanazawa Institute of Technology, Nonoichi-machi (JP)

( * ) Notice: Subject to any disclaimer, the term of this patent is extended or adjusted under 35 U.S.C. 154(b) by 0 days.

(21) Appl. No.: 10/333,318

(22) PCT Filed: Mar. 22, 2002

(86) PCT No.: PCT/JP02/02802

§ 371 (c)(1),
(2), (4) Date: Jan. 16, 2003

(87) PCT Pub. No.: WO02/093615

PCT Pub. Date: Nov. 21, 2002

(65) Prior Publication Data

US 2003/0154773 A1 Aug. 21, 2003

Related U.S. Application Data

(60) Provisional application No. 60/278,423, filed on Mar. 26, 2001.

(51) Int. Cl.[7] ........................ G12B 21/04; G01N 13/12; H01J 37/285
(52) U.S. Cl. ........................ 250/306; 250/307; 250/309; 250/288
(58) Field of Search ................................ 250/306, 307, 250/309, 288

(56) References Cited

U.S. PATENT DOCUMENTS

| | | | | |
|---|---|---|---|---|
| 5,440,124 A | * | 8/1995 | Kelly et al. | 250/309 |
| 5,444,260 A | * | 8/1995 | Kazmerski | 250/306 |
| 6,580,069 B1 | * | 6/2003 | Cerezo | 250/288 |
| 6,797,952 B2 | * | 9/2004 | Kaito et al. | 250/306 |
| 2003/0066962 A1 | * | 4/2003 | Kaito et al. | 250/306 |

FOREIGN PATENT DOCUMENTS

| | | |
|---|---|---|
| JP | 09-189680 | 7/1997 |
| JP | 2000-283909 | 10/2000 |
| JP | 2002-014027 | 1/2002 |
| JP | 2002-042715 | 2/2002 |

OTHER PUBLICATIONS

Isamu Nishikawa, Masafumi Watanabe, Keiji Tanaka, Takaya Yagyu; Shigeru Yamamoto ; Atomic Level Analysis of Electronic Materials by the Atom Probe and Development of 3–Dimentional Scanning Atom Probe; Kanazawa Institute of Technology, Dept. of Materials Science and Technology, The Institute of Electronics, Information and Communication Engineers, Technical Report of IEICE, ED2000 (Dec. 2000).

* cited by examiner

Primary Examiner—Jack I. Berman
(74) Attorney, Agent, or Firm—Marger Johnson & McCollom, P.C.

(57) ABSTRACT

In a scanning atom probe (100), a surface topography of a specimen (3) is firstly analyzed by a surface topography analyzing unit (20). In the next place, an extraction electrode (5) is aligned to a desired area to be analyzed of a specimen surface. In case of analyzing electronic state of the area to be analyzed, negative bias voltage is impressed onto the specimen (3) from a direct current high voltage supply (2) and field emitted electrons are detected by a screen (9). In case of analyzing atomic arrangement and composition of the area to be analyzed, positive voltage is impressed onto the specimen (3) from the direct current high voltage supply (2) and a pulse generator (1) and positive ions generated by field evaporation are detected by a position sensitive ion detector (11) or a relfectron type mass analyzer (13).

17 Claims, 5 Drawing Sheets

SCANNING ATOM PROBE AND ANALYSIS METHOD UTILIZING SCANNING ATOM PROBE

This application claims the benefit of Provisional Application No. 60/278,423, filed Mar. 26, 2001.

BACKGROUND OF THE INVENTION

1. Technical Field

The present invention relates to an analysis apparatus and an analysis method for analyzing specimens and particularly relates to a scanning atom probe which can analyze the surface of the specimens with a resolving power of an atomic level and an analysis method utilizing the scanning atom probe.

2. Background Technology

A field emission microscope (hereinafter also referred to as "FEM") is a known apparatus that enables atomic level analysis of the surface of specimens. In the FEM, high negative voltage is impressed onto a long sharp tip of a specimen and a high electric field is generated at an apex thereof, which has a hemispheric shape. This high electric field lowers a potential barrier which confines electrons to the surface. When the electric field is sufficiently high, the width of the barrier becomes about 1 nanometer and the electrons are emitted through the potential barrier in accordance with the Heisenberg uncertainty principle. Then a tone image is displayed on a screen in front of the long and sharp tip of the sample by the incident electrons. The tone image correspondent to a work function of each area in the apex of the long and sharp tip is projected on the screen in an expanded manner because the electrons are radially emitted in the radial directions of the hemispheric apex. Magnification of the image is almost equal to ratio between radius of curvature of the apex and a distance from the apex to the screen. Assume that the radius of curvature is 100 nanometers and the distance is 10 centimeters, the magnification becomes about one million times. This magnification is high enough for observing atoms directly. Atom-by-atom observation is, however, impossible because, according to the Heisenberg uncertainty principle, uncertainty width of positions from which the electrons are emitted is larger than distance between one atom and another, and accordingly a resolving power becomes low, such as about 1 nanometer. It is, however, possible to analyze a work function and electronic state of a micro area based on an I-V characteristic of each area on the screen because the density of emission current varies widely in accordance with the work function of the emitting area.

When the atoms which are further heavier than electrons are emitted, the sufficiently high resolution can be obtained, that enables the direct atom-by-atom observation, because the uncertainty width of the emitting position becomes smaller, such as below 0.1 nanometer. A field ion microscope (hereinafter also referred to as "FIM") enables this atom-by-atom observation. In the FIM, inert gas, such as helium or neon, is injected into a specimen vessel and positive high voltage is impressed on the long sharp tip of the specimen. An atom of the gas is field ionized right above each atom of the apex of the tip and emitted as a positive ion when an electric field generated at the apex is sufficiently high. The trajectories of the positive ions are almost same as those of the electrons in the FEM, and arrangement of the atoms on the hemispheric apex of the tip is directly projected on a screen when resolving power is increased by cooling the gas and inhibiting thermal agitation. Not only the atoms of the gas but also the atoms of the surface of the apex are emitted as positive ions if the electric field generated on the apex becomes still higher. By utilizing this field evaporation, a layer of the atoms in the surface of the apex can be separated therefrom layer-by-layer and accordingly each layer inside the apex can be sequentially observed from the surface.

An atom probe (hereinafter also referred to as "AP") is an apparatus which enables the analysis of the compositional distribution of the evaporated area with the atomic level resolution by inletting the evaporated positive ions into the mass analysis device when the atoms in the specimen surface are field evaporated as the positive ions by the FIM. The AP has an outstanding function of detecting and identifying the atoms observed by the FIM one by one. The specimen, however, must be needle shaped similar as the specimen analyzed by the FEM or the FIM and also the apex there of must be grinded so that the radius of curvature of the apex might become below about 100 nanometers. It is not easy to grind conductive organic materials, ceramics, diamonds or the like in this manner and accordingly materials to be observed by the FEM, FIM and AP have been limited to specific specimens.

In order to solve the problem described above, the inventor of the present invention has created the scanning atom probe (hereinafter also referred to as "SAP"), which does not require the needle-shaped specimens. The technology of the SAP is, for example, disclosed in the Japanese patent application laid-open No. H7-43373. The SAP is provided with a minute funnel-shaped extraction electrode and scans over the surface of planate specimens with this extraction electrode. When there is a minute cusp of several micrometers on the specimen surface and a precise alignment of the center of an open hole at a sharp end of the extraction electrode and the apex of the cusp is obtained, a high electric field generated in a minute space between the cusp and the hole field evaporates atoms in the apex of the cusp and accordingly the SAP can analyze specimens in a manner similar to the AP.

The development of the SAP has extremely increased the variety of specimens that can be analyzed. The inventor of the present invention continuing his efforts to further improve the SAP in order that this outstanding apparatus might be utilized more widely among scientists and might bring remarkable study results.

DISCLOSURE OF THE INVENTION

The present invention has been achieved in view of the above current situation, and accordingly aims to provide an analysis apparatus and an analysis method which are more convenient. To be more specific, the object of the present invention is to provide a technology for analyzing the surface of planate specimens with selecting an arbitrary area thereof.

A preferred embodiment of the present invention relates to the analysis apparatus. This analysis apparatus comprises an electrode which scans over the surface of a specimen, a voltage supply which supplies voltage to the specimen, an ion detector which detects ions generated by field evaporation when the voltage is supplied, which is sufficiently high for atoms of the specimen surface to be field evaporated, and a surface topography analyzing unit which analyzes a topography of the specimen surface. By being provided with the surface topography analyzing unit, the apparatus can acquire information on shape of the specimen surface precisely and an area to be analyzed can be properly selected.

The electrode may be a funnel-shaped extraction electrode. It becomes possible to analyze a specimen which has a planate surface and can not be analyzed with a known atom probe, by utilizing the extraction electrode.

The specimen surface may be planate. The surface topography analyzing unit may search for a cusp on the surface and the position of the electrode may be aligned to an apex of the cusp. The ion detector may detect the ions which are field evaporated from the apex of the cusp.

The surface topography analyzing unit may be a scanning tunneling microscope. The surface topography analyzing unit also may be an atomic force microscope. The analysis apparatus may naturally be provided with these two microscopes. It is sufficient if the microscope to be utilized is selected according to a characteristic of the specimen.

The surface topography analyzing unit may scan over the surface of the specimen with a probe which can be interchanged with the electrode. The surface topography analyzing unit may scan over the specimen surface utilizing the electrode as the probe. The electrode may be funnel-shaped and may comprise a cusp functioning as the probe, which is formed at a rim of an open hole of a specimen-side apex of the electrode. The topography of the surface can be more finely acquired by providing the sharp needle-shaped cusp to the apex of the electrode, when the electrode for the atom probe is also utilized as the probe for the scanning tunneling microscope or the atomic force microscope.

The apparatus may further comprise a laser which irradiates a laser beam to the specimen so that the atoms of the specimen surface might be evaporated by the phenomenon called photo-stimulated field evaporation. Accordingly, low conductive materials can be analyzed, which cannot be analyzed with the conventional atom probe.

The ion detector may comprise a position sensitive ion detector which can analyze the positions of the ions generated by the field evaporation. Arrangement of the atoms in the area to be analyzed of the specimen can be acquired by this position sensitive ion detector. The ion detector may comprise a mass analyzer which can analyze the mass of the ions generated by the field evaporation. Accordingly, composition of the area to be analyzed of the specimen can be grasped.

The apparatus may further comprise a projection unit which projects an image by field emitted electrons when the sufficiently high voltage for the electrons of the specimen surface to be field emitted is supplied by the voltage supply. The apparatus may further comprise a first current meter which measures a current value of electrons among the field emitted electrons, which enter the electrode. The apparatus may further comprise a second current meter which measures a current value of electrons among the field emitted electrons, which enter the projection unit. The position of the electrode may be adjusted based on the current value measured by the first current meter or the second current meter.

Another embodiment of the present invention relates to the analysis method. This analysis method comprises a processing of acquiring a surface topography of a specimen by scanning over the surface of the specimen with a first probe, a processing of aligning the first probe or a second probe which can be interchanged with the first probe to an apex of a cusp on the surface after grounding the first probe or the second probe, a processing of field evaporating atoms of the surface by supplying positive voltage to the specimen and a processing of detecting ions generated by field evaporation.

Three dimensional arrangement of the atoms of the specimen may be acquired by repeating the processing of field evaporating the atoms and the processing of detecting the ions.

The method may further comprise a processing of detecting electrons of the surface, which are field emitted therefrom by supplying negative voltage to the specimen, and a processing of measuring relation between a voltage value and a current value of the electrons when the voltage value of the negative voltage is changed. Status of the electrons can be grasped from an I-V characteristic thereof.

Moreover, arbitrary combinations of the above-described elements and so forth, as well as expressions thereof changed between a method, an apparatus, a recording medium, a computer program, etc. are encompassed by the scope of the present invention.

BRIEF DESCRIPTION OF THE DRAWINGS

The above described objectives, other objectives, features and advantages are further made clear by the following preferred embodiments and drawings accompanied thereby.

THE BEST MODE FOR CARRYING OUT THE INVENTION

Figure 1:
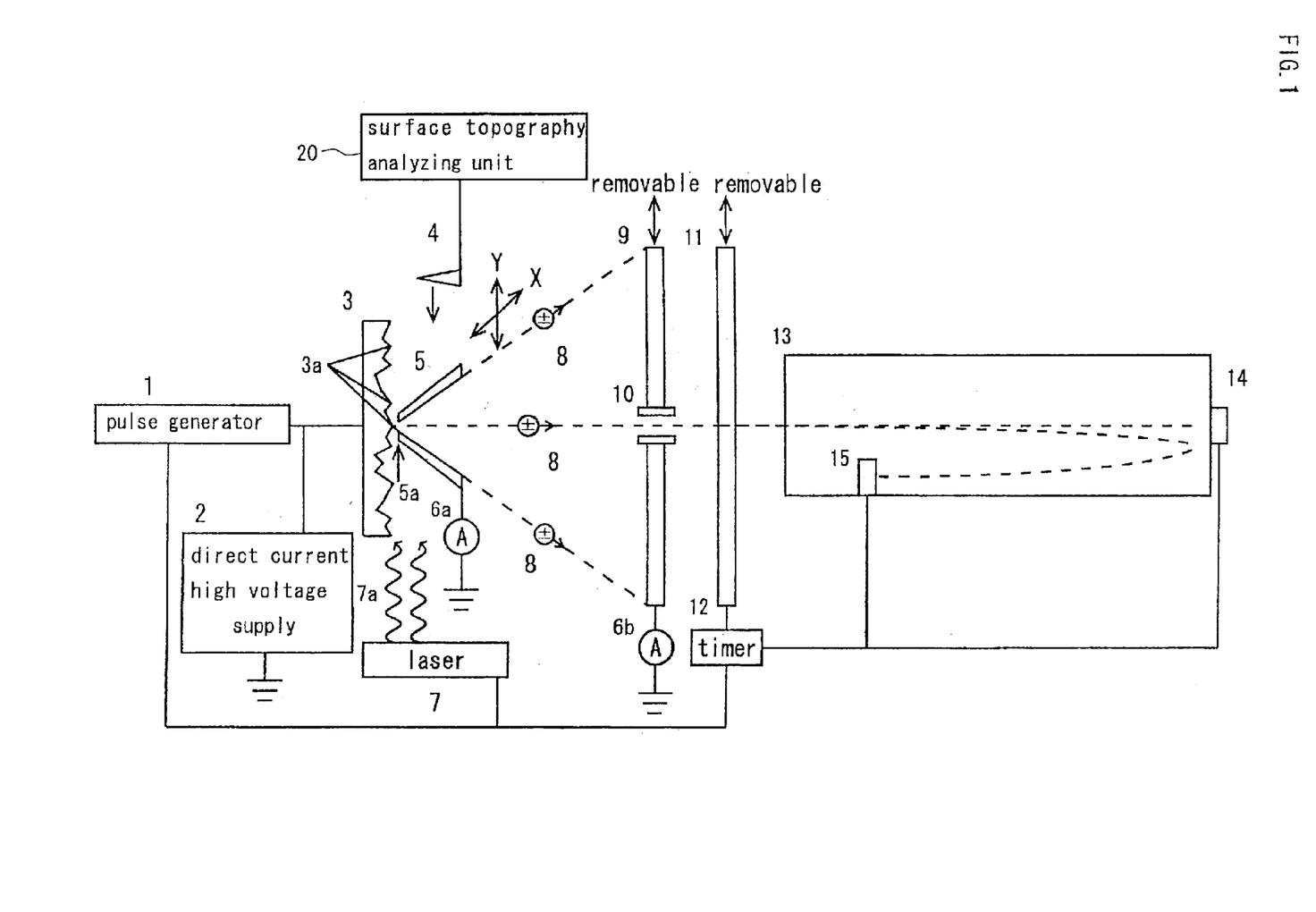
FIG. 1 is a diagram showing an entire structure of a scanning atom probe according to an embodiment in which the present invention is embodied.
Figure 2:
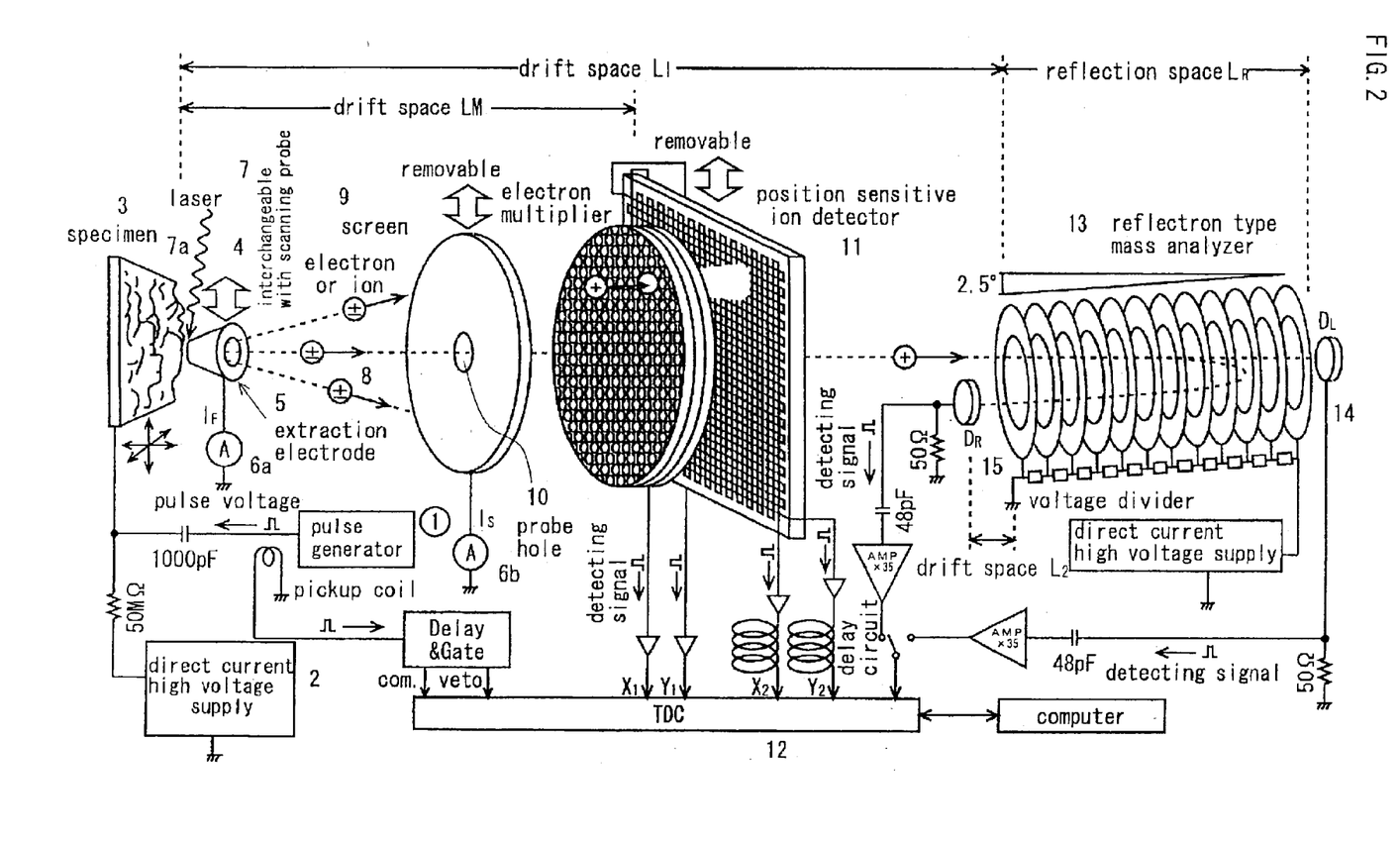
FIG. 2 is a pattern diagram showing the entire structure of the scanning atom probe according to the embodiment.
Figure 3:
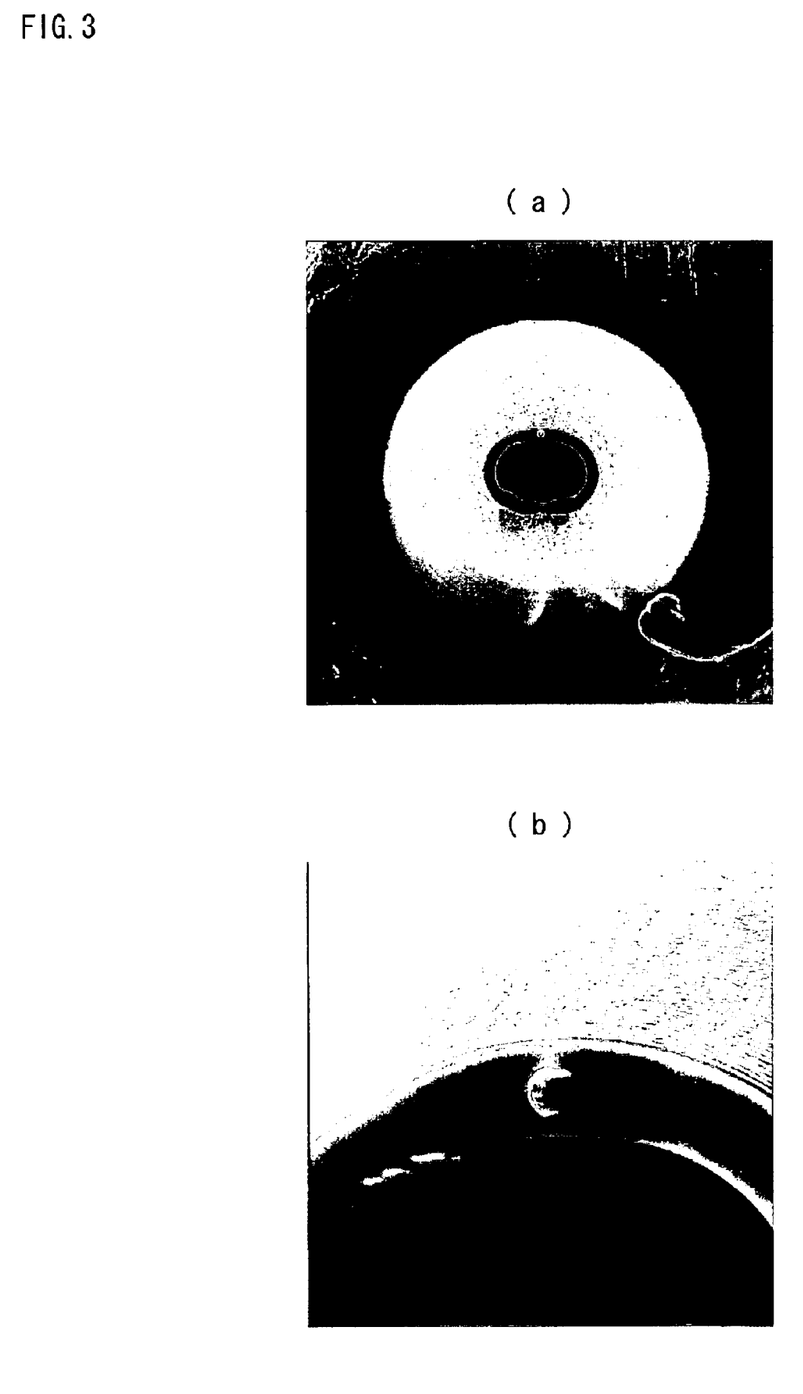
FIG. 3(a) is an image of a minute electrode formed on a specimen-side apex of an extraction electrode by a CVD method and FIG. 3(b) is an image of a pillar formed on the apex thereof, which are both halftone photographic images displayed on a display.
Figure 4:
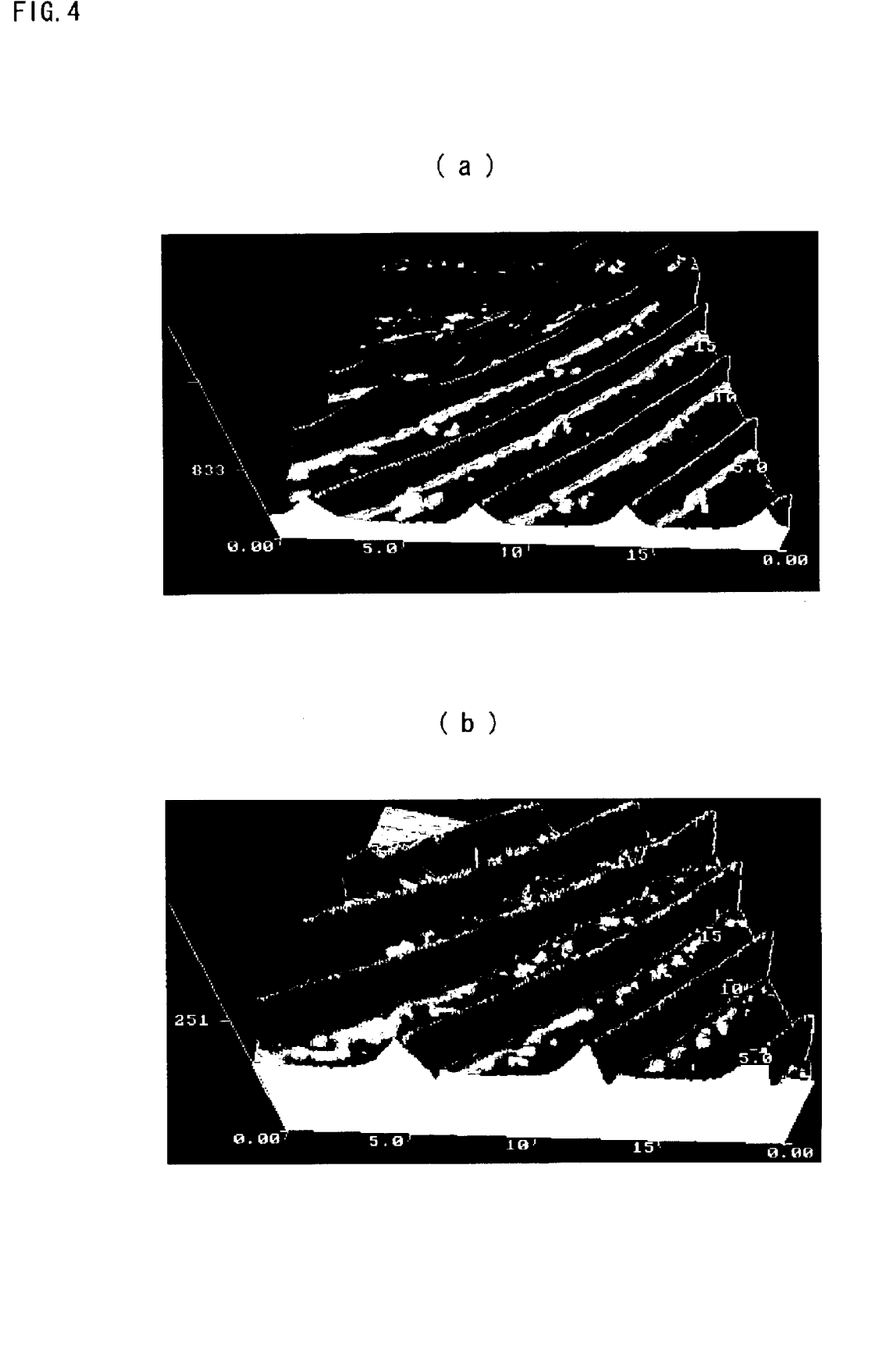
FIG. 4(a) is an image of a surface topography of the specimen acquired by the extraction electrode provided with the pillar and FIG. 4(b) is an image of the surface topography of the specimen acquired by a normal tungsten probe, which are both halftone photographic images displayed on the display.

FIG. 1 is a diagram showing an entire structure of a scanning atom probe as an example of an analysis apparatus according to this embodiment. FIG. 2 is a pattern diagram showing the entire structure of the scanning atom probe. Same symbols are given to same component members in FIG. 1 and FIG. 2. A part of the component members of the scanning atom probe in FIG. 1 is shown by perspective illustrations in FIG. 2, in order to make it easy to understand. Hereunder, description will be made referring to each figure according to necessity.

The scanning atom probe 100 mainly comprises a pulse generator 1 and a direct current high voltage supply 2 which are examples of a voltage supply, an extraction electrode 5 which scans over a surface of a specimen 3, a probe 4 which can be interchanged with the extraction electrode 5, a screen 9 which is an example of a projection unit on which an image by electrons field emitted from the specimen 3 is projected, a first current meter 6a which measures an electric current value of the electrons that enter the extraction electrode 5, a second current meter 6b which measures a current value of the electrons that enter the screen 9, a laser 7 which irradiates a pulsed laser beam on the surface of the specimen 3, a position sensitive ion detector 11 which detects positive ions field evaporated from the specimen 3, a reflectron type mass analyzer 13 which analyzes mass of the positive ions field evaporated from the specimen 3, a timer 12 which measures flight times of the ions and a surface topography analyzing unit 20 which analyzes the surface topography of the specimen 3 with the probe 4.

Hereunder will be described a procedure of the analysis method of the specimen by this scanning atom probe. At first, direct current bias voltage supplied by the direct current high voltage supply 2 is impressed on the specimen 3 and the extraction electrode 5, which is grounded, scans over the surface of the specimen 3 searching for a minute cusp 3a. The surface of the specimen 3 may be grooved by a dicing saw in a checkerboard pattern when the surface is flatly polished. It is preferable that the depth and the interval of the grooved ditches are less than 10 micrometers. The ungrooved areas are areas to be analyzed. The analysis may be performed after placing the specimen in corrosive liquid or gas, in order to study corrosion effect. It can be understood that the analyzed areas, that is the uncorroded areas, are corrosion resistive areas because the corroded areas are dented.

The high negative field is generated in a small space between the cusp 3a on the specimen surface and the open hole of the extraction electrode 5 when the sharp end of the extraction electrode 5 is positioned close to the specimen surface and negative voltage is impressed to the specimen 3. Then the electrons are field emitted from the apex of the cusp 3a. Almost all field emitted electrons 8 fly to the screen 9 projecting the enlarged image of the surface of the cusp 3a when the apex of the cusp 3a and the center of the open hole 5a of the extraction electrode are precisely aligned. At this time, the current flowing through the second current meter 6b is maximized. Almost all field emitted electrons flow in the extraction electrode 5 and the current thereof is measured by the first current meter 6a if the apex of the cusp 3a and the open hole 5a of the electrode are misaligned. Then the current flowing through the second current meter 6b decreases. Thus the electric current by the field emitted electrons, which is measured by the first current meter 6a and the second current meter 6b, varies as the extraction electrode 5 scans over the surface of the specimen 3 reflecting the topography of the specimen surface. By utilizing this phenomenon, it becomes possible to assume the position of the apex of the cusp 3a to be analyzed and align the position of the extraction electrode 5 thereto.

Another method for the alignment of the apex of the cusp 3a of the specimen 3 and the extraction electrode 5a utilizes a technology of a scanning tunneling microscope (hereinafter also referred to as "STM"), an atomic force microscope (hereinafter also referred to as "AFM") or a scanning probe microscope (hereinafter also referred to as "SPM"). In the example shown in FIG. 1 and FIG. 2, the SAP 100 comprises the probe 4 which can be interchanged with the extraction electrode 5. The STM may be utilized as the surface topography analyzing unit 20 and a probe for the STM may be utilized as the probe 4 when the specimen is a conductive material. The AFM may be utilized as the surface topography analyzing unit 20 and a probe for the AFM may be utilized as the probe 4 when the specimen is an insulative material.

The topography of the specimen surface is depicted by the surface topography analyzing unit 20 by replacing the extraction electrode 5 with the probe 4 and scanning over the specimen surface with the probe 4. Not only the topography of the specimen surface but also atomic arrangement of the surface of the apex of the cusp to be mass analyzed by the SAP 100 is depicted by the probe 4. The extraction electrode 5 is aligned right above the preferred cusp after mapping the surface topography. According to this method, it is possible to find a correlation between the atomic arrangement and the composition of the analyzed area because preferred area is selected and each atomic layer thereof can be mass analyzed after acquiring the topography and atomic arrangement of the specimen surface.

The extraction electrode 5 may be utilized as the probe 4 of the surface topography analyzing unit 20. This will be specifically described in description on FIG. 3 and FIG. 4.

The negative bias voltage is impressed to the specimen 3 by the direct current high voltage supply 2 after aligning the center of the open hole 5a at the apex of the extraction electrode 5 to the apex of the cusp 3a on the specimen 3, and the electrons are field emitted from the apex of the cusp 3a. The emitted electrons enter the screen 9 and the value of the current thereby is measured by the current meter 6b. The value of the negative bias voltage is changed and the variation of the current value (I-V plot) in accordance with the change of the bias voltage is measured. Accordingly, the electronic state of the analyzed area can be investigated.

In the next place, positive direct current bias voltage is impressed on the specimen 3 and positive pulsed voltage is impressed by the pulse generator 1 in a manner that it is superposed on the positive direct current bias voltage. The atoms of the surface of the apex of the cusp 3a are field evaporated as positive ions 8 when the summation of the direct current bias voltage and the pulsed voltage is sufficiently high and the ions 8 fly to the screen 9 taking nearly identical trajectories with the field emitted electrons 8. The pulsed voltage is not transmitted to the apex of the cusp 3a if the specimen 3 is a low conductive material such as the insulative material or a semi-conductive material. A pulsed laser beam 7a is, therefore, irradiated to the specimen 3 on which the direct current voltage is impressed so that the atoms of the surface might be emitted as the positive ions by the photo-stimulated field evaporation. In this manner, low conductive materials can be analyzed similar as conductive materials, which have not been suitable for the analysis by the conventional AP.

The screen 9 is removed and the positive ions 8 are made to enter the position sensitive ion detector 11 in order to mass analyze every field evaporated positive ion 8. An apparatus disclosed in U.S. Pat. No. 5,644,128 is, for example, suitable to be utilized as the position sensitive ion detector 11. The timer 12 measures the flight time of the positive ion 8 from the cusp 3a to the position sensitive ion detector 11. The timer 12 starts the measurement by receiving a start signal from the pulse generator 1 and stops the measurement in accordance with a signal from the position sensitive ion detector 11. The flight time of the positive ion 8 is accordingly measured in this manner. The mass to charge ratio of the detected ion is obtained based on the flight time of the ion, the total voltage values applied to the specimen 3 and a flight path from the specimen surface to the position sensitive ion detector 11. A three dimensional arrangement of the constituent atoms of the area to be analyzed can be observed because the incident sites on the position sensitive ion detector 11 have one-to-one correspondence with the original sites of the evaporated atoms and the atoms can be evaporated and detected layer-by-layer by the field evaporation. An area of 80 atoms×80 atoms can be, for example, analyzed when a position sensitive ion detector 11 which is a square of 40 millimeters length and width and of which position resolving power is 0.5 millimeter. In this time, three dimensional compositional distribution of 640 thousand atoms can be acquired by analyzing 100 atomic layers in a depth direction.

The mass resolution of a time-of-flight mass analyzer depends on the accuracy of the flight times of the ions. A long flight path of the ion is favorable for improving the mass resolution because the time resolution of the timer 12 is limited. This means that the longer the flight path is, the higher the mass resolution becomes. The SAP 100 according to this embodiment makes use of the reflectron type mass analyzer 13 in order to realize a higher mass resolution. The position sensitive ion detector 11 is removed and the screen 9 is inserted into the original position for the mass analysis of the high resolution on the area to be analyzed.

The electrons are field emitted from the apex of the cusp 3a and an image reflecting the electronic state is projected on the screen 9. The pulsed voltage or the pulsed laser beam is impressed on the specimen 3 and the atoms of the surface are field evaporated when the desirable area is imaged at a probe hole 10 of the screen 9. The positive ions field evaporated from the area to be analyzed pass through the probe hole 10 and enter a flight space of the reflectron type mass analyzer 13. The refelectron type mass analyzer 13 comprises a first ion detector 14 which is located at the end of the straight flight path and a second ion detector 15 which is located at the entrance side of the reflectron. The first ion detector 14 can detect the atoms which are neutralized after the field evaporation. The second ion detector 15 can detect the ions with a high resolution. When the ions are detected by the first ion detector 14 and the second detector 15, signals indicating that the ions are detected are transmitted to the timers and accordingly the flight times of the ions are measured. The reflectron type mass analyzer 13 can analyze the mass of the ions with higher accuracy than the position sensitive ion detector 11 though the area in the specimen surface which is analyzed by the reflectron type mass analyzer 13 is narrower than that of the position sensitive ion detector 11 and is, for example, an area of several nanometers in diameter. It is, therefore, sufficient if the reflectron type mass analyzer 13 or the position sensitive ion detector 11 is selected to be utilized in accordance with necessity.

The surface topography analyzing unit 20 may utilize the extraction electrode 5 as the probe 4 though the unit 20 scans over the surface of the specimen 3 with the probe 4, which can be interchanged with the extraction electrode 5, in the embodiment shown in FIG. 1 and FIG. 2.

FIG. 3(a) and FIG. 3(b) show a minute cusp, which functions as the probe 4, formed at the rim of the hole 5a of the specimen-side apex of the extraction electrode 5. By an ion beam CVD method, a minute electrode of carbon or tungsten, which is 40 micrometers in height, 35 micrometers in a diameter of the basement, 10 micrometers in a diameter of a ring at the apex and 0.6 micrometer in thickness of the ring, is formed at the apex of a platinum extraction electrode and a cusp called the pillar is formed on the ring at the apex, which is about 1.2 micrometers in height and has a hemispheric apex of about 80 nanometers in a diameter. FIG. 3(a) shows the minute electrode formed by the CVD method and FIG. 3(b) shows the pillar at the apex of the minute electrode.

FIG. 4(a) shows the surface topography of the specimen acquired by the extraction electrode 5 shown in FIG. 3(a) and FIG. 3(b). FIG. 4(b) shows the surface topography of the specimen acquired by the normal tungsten probe 4. Both of the images are clear and high resolution, and there was no difference between the depth profiles of the images. From the above-described facts, it is confirmed that the surface topography of the specimen is accurately depicted by the pillar formed on the apex of the extraction electrode 5. It is preferable that the pillar is formed by material which has a large work function and is durable, such as iridium or conductive carbide, though the pillar is made of the carbon or the tungsten from the view point of easiness of manufacturing in this embodiment.

Figure 5:
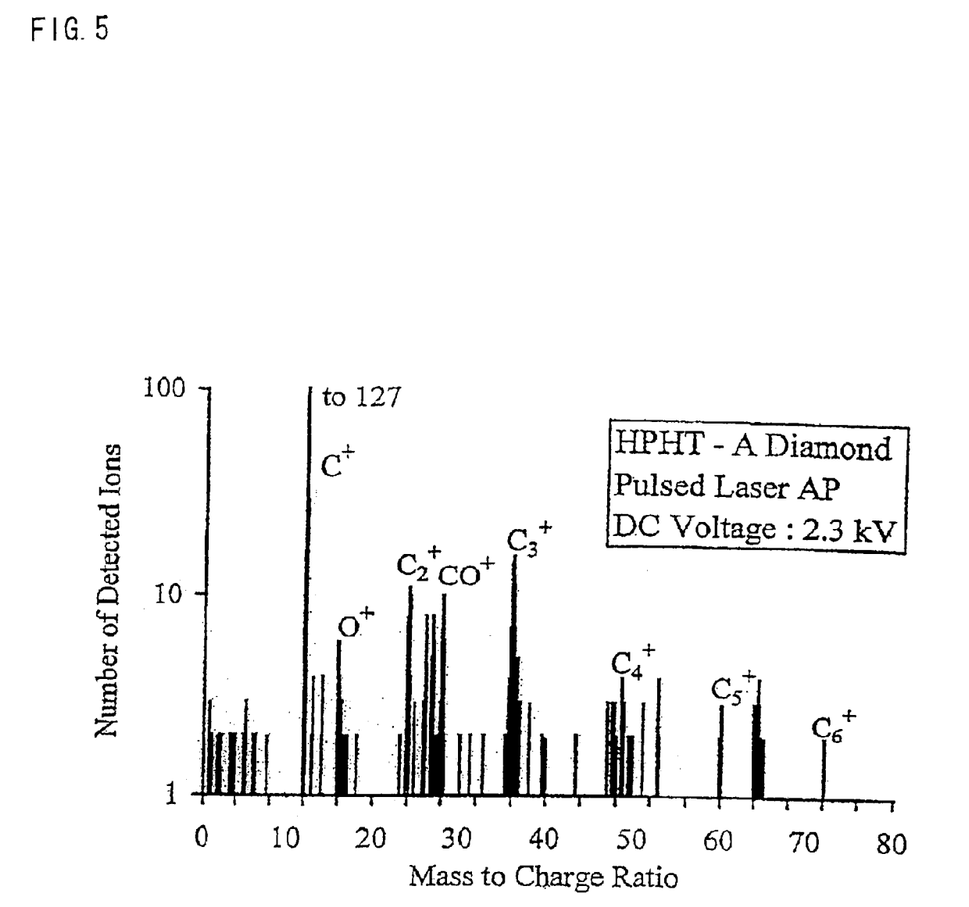
FIG. 5 is a diagram showing a result of analysis in which artificial diamond is analyzed with the scanning atom probe according to this embodiment.

FIG. 5 shows a result of the analysis on artificial diamond by the SAP 100 according to this embodiment. By the SAP 100 according to this embodiment, it is possible to analyze the diamond produced by a chemical vapor deposition method or a high pressure and temperature method or graphite of various purities, since there is no need to fabricate the specimen into the long and sharp tip. FIG. 5 is a mass spectrum acquired by analyzing the diamond produced by the high pressure and temperature method. It is shown therein that a large number of carbon atoms are detected as clusters. As described above, by the SAP according to this embodiment, bond state of the atoms can be observed because it can be investigated that, by cutting which bond of the atoms, the ions are generated in the field evaporation.

The scanning atom probe 100 of the present embodiment brings about following excellent effects.

1) It becomes not necessary to fabricate the specimen into the long and sharp tip by the introduction of the extraction electrode 5. Even though the planate specimen can be analyzed if there are cusps of several micrometers on the surface thereof.

2) It is easy to irradiate the pulsed laser beam because the specimen is planate. It is, therefore, possible to analyze semi-conductive materials by utilizing the photo-stimulated field evaporation.

3) By improving the speed of the analysis and the ability of data processing, it becomes possible to perform microanalysis of a ppm level and even of a ppb level.

4) It is possible to make clear the electronic state of the analyzed area based on the I-V characteristic of the field emission.

5) The bond state of the atoms can be observed based on the statistical distribution of ionic species because weak bonds of atoms tend to be cut in the field evaporation.

Moreover, the SAP has following advantages in comparison with a secondary ion mass spectrometer (SIMS) and an Auger electron spectroscope (AES).

1) The SAP has the resolution of the one atomic layer in the depth direction and also has the lateral resolution of the atomic level. Accordingly, the three dimensional compositional distribution can be acquired at the high resolution of the atomic level.

2) The detectivity of the ion detector is equivalent for every atom and molecule. The SAP can, therefore, detect hydrogen which can not be detected by the AES.

3) The bond state of the atoms inside the specimen can be observed by detecting the ionic species, especially by detecting the clusters.

4) It is possible to make clear the relativity between the electronic state and the composition based on the I-V characteristic of the field emitted current from the analyzed area.

5) By increasing the number of the atoms to be detected, it becomes possible to perform microanalysis of the ppm level and even of the ppb level.

Industrial Usability

As have been described, the present invention can be utilized in the analysis apparatus and the analysis method for analyzing the surface of the specimens.

What is claimed is:

1. An analysis apparatus comprising:
an electrode which scans over a surface of a specimen;

a voltage supply which supplies voltage to the specimen;

an ion detector which detects ions generated by field evaporation when sufficiently high voltage is supplied for atoms of the surface of the specimen to be field evaporated by the voltage supply; and a surface topography analyzing unit which analyzes topography of the surface of the specimen, wherein the surface topography analyzing unit is structured for scanning over the surface of the specimen utilizing the electrode as a probe, and wherein the electrode is funnel-shaped and has a cusp functioning as the probe at a rim of a hole of a specimen-side apex.

2. An analysis apparatus as recited in claim 1, characterized in that the surface of the specimen is planate, characterized in that the surface topography analyzing unit searches for a cusp on the surface, characterized in that a position of the electrode is aligned to an apex of the cusp, and characterized in that the ion detector detects the ions field evaporated from the apex of the cusp.

3. An analysis apparatus as recited in claim 1, characterized in that the surface topography analyzing unit is a scanning tunneling microscope.

4. An analysis apparatus as recited in claim 1, characterized in that the surface topography analyzing unit is an atomic force microscope.

5. An analysis apparatus as recited in claim 1, characterized in that the surface topography analyzing unit scans over the surface of the specimen with a probe which can be interchanged with the electrode.

6. An analysis apparatus as recited in claim 1, characterized in that it further comprises a laser which irradiates a laser beam on the specimen so that the atoms of the surface of the specimen might be field evaporated by photostimulated field evaporation.

7. An analysis apparatus as recited in any one of claim 1, characterized in that the ion detector comprises a position sensitive ion detector which can analyze positions of the ions generated by the field evaporation.

8. An analysis apparatus as recited in any one of claim 1, characterized in that the ion detector comprises a mass analyzer which can analyze mass of the ions generated by the field evaporation.

9. An analysis apparatus as recited in any one of claim 1, characterized in that it further comprises a projection unit which projects an image by field emitted electrons when the sufficiently high voltage for the electrons of the surface of the specimen to be field emitted is supplied by the voltage supply.

10. An analysis apparatus as recited in claim 9, characterized in that it further comprises a first current meter which measures a current value of electrons among the field emitted electrons, which enter the electrode.

11. An analysis apparatus as recited in claim 9, characterized in that it further comprises a second current meter which measures the current value of electrons among the field emitted electrons, which enter the projection unit.

12. An analysis apparatus as recited in claim 10, characterized in that the position of the electrode is aligned based on the current value measured by the first current meter or the second current meter.

13. An analysis apparatus as recited in claim 11, characterized in that the position of the electrode is aligned based on the current value measured by the second current meter.

14. An analysis method comprising:

acquiring surface topography of a specimen by scanning over a surface of the specimen by using a cusp formed at a rim of a hole of a specimen-side apex of a funnel-shaped electrode as a probe;

aligning the electrode to an apex of a cusp on the surface;

field evaporating the atoms of the surface by supplying positive voltage to the specimen; and detecting ions generated by field evaporation.

15. An analysis method as recited in claim 14, characterized in that it acquires three dimensional arrangement of the atoms in the specimen by repeating the processing of field evaporating the atoms and the processing of detecting the ions.

16. An analysis method as recited in claim 14, characterized in that it further comprises:

detecting electrons, which are the electrons of the surface field emitted by supplying negative voltage to the specimen; and measuring relativity between a voltage value of the negative voltage and a current value of the electrons when the voltage value is changed.

17. An analysis method as recited in claim 15, characterized in that it further comprises:

detecting electrons, which are the electrons of the surface field emitted by supplying negative voltage to the specimen; and measuring relativity between a voltage value of the negative voltage and a current value of the electrons when the voltage value is changed.

* * * * *